United States Patent
Barrett et al.

(10) Patent No.: US 7,567,892 B2
(45) Date of Patent: Jul. 28, 2009

(54) METHOD AND SYSTEM FOR REALIZING A LOGIC MODEL DESIGN

(75) Inventors: Geoff Barrett, Bristol (GB); Simon Christopher Dequin Clemow, Bristol (GB); Andrew Jon Dawson, Bristol (GB)

(73) Assignee: Broadcom Corporation, Irvine, CA (US)

( * ) Notice: Subject to any disclaimer, the term of this patent is extended or adjusted under 35 U.S.C. 154(b) by 1317 days.

(21) Appl. No.: 10/284,294

(22) Filed: Oct. 31, 2002

(65) Prior Publication Data
US 2003/0225557 A1  Dec. 4, 2003

Related U.S. Application Data

(60) Provisional application No. 60/383,755, filed on May 29, 2002.

(51) Int. Cl.
*G06F 17/50* (2006.01)
(52) U.S. Cl. .................................. 703/14; 716/4; 716/5
(58) Field of Classification Search .................. 703/14; 716/4, 5
See application file for complete search history.

(56) References Cited

U.S. PATENT DOCUMENTS

| | | | | |
|---|---|---|---|---|
| 5,699,283 A | * | 12/1997 | Okazaki et al. | 703/15 |
| 5,751,592 A | * | 5/1998 | Takai et al. | 716/5 |
| 6,564,367 B1 | * | 5/2003 | Fujii et al. | 716/16 |
| 6,687,865 B1 | * | 2/2004 | Dervisoglu et al. | 714/726 |
| 6,751,768 B2 | * | 6/2004 | Muradali et al. | 714/738 |
| 6,829,574 B1 | * | 12/2004 | Ito et al. | 703/28 |
| 6,856,950 B1 | * | 2/2005 | Abts et al. | 703/13 |

* cited by examiner

*Primary Examiner*—Paul L Rodriguez
*Assistant Examiner*—Andre Pierre Louis
(74) *Attorney, Agent, or Firm*—Sterne, Kessler, Goldstein & Fox P.L.L.C.

(57) ABSTRACT

Techniques directed to realizing and verifying a logic model design are provided by first dividing the logic model design into two or more logic portions. The various model portions can then realized to form various realized logic portions. A first realized logic portion can then be wrapped and formally verified against its respective model. The wrapper can then be verified by first applying the wrapper to a second logic model portion and a second realized logic portion, then formally verifying them against each other. The resulting output can then be used to prove wrapper correctness.

36 Claims, 10 Drawing Sheets

METHOD AND SYSTEM FOR REALIZING A LOGIC MODEL DESIGN

CROSS-REFERENCE TO RELATED APPLICATION

This application claims priority to Provisional U.S. Patent Application No. 60/383,755, filed 29 May 2002, which is incorporated herein by reference in its entirety.

FIELD OF THE INVENTION

This invention relates to methods and systems for realizing logic model designs and particularly to development and verification of integrated circuit designs.

BACKGROUND OF THE INVENTION

Integrated circuit designers have an array of modem tools, such as schematic entry programs and various descriptive languages, e.g., Verilog and VHDL (Very High-Level Descriptive Language), to facilitate the creation of various logic designs. Once a particular logic design is initially created, a designer may wish to compile the logic design to remove various errors. For example, compiling a VHDL file may reveal any of (1) minor syntax errors, (2) potential problems, i.e., warnings, that may or may not be of consequence and (3) major design errors of functional consequence. Typically, a designer can modify the entry file of a logic design until a compiler indicates that all design errors are apparently removed and any residual warnings are either removed or otherwise deemed harmless by the designer. The resulting compiled design can then be considered a model of the logic design.

Once a logic design is compiled, the integrated circuit designer may then wish to "realize" the resulting logic model. That is, a designer may wish to perform a number of operations on the logic model to convert the logic model from abstract mathematical and functional relationships to a more low-level form consisting of a description of various logic circuits and interconnecting pins, eg a gate level Verilog netlist.

Once the logic model is realized, the integrated circuit designer may wish to verify the functionality of the realized logic design. Conventional verification approaches include applying a "wrapper" to the realized logic design and then performing a simulation on the wrapped realized logic design. A wrapper is a software construct that enables a designer to interact with a logic design on a pin (nodal) level, i.e., feed simulated electrical signals to the realized logic design and/or estimate/measure the resulting signals produced by the realized logic design.

Unfortunately, verification techniques based on simulations of wrapped logic designs can require large amounts of computer processing power and memory. To complicate this issue, it should be appreciated that modern day integrated circuits have dramatically increased in size and capacity. That is, modern electronic technology has made it possible to put large numbers of increasingly complex electronic circuits on practicable-sized silicon dies. As a result, verifying such large logic designs can require impracticable amounts of computer resources. Accordingly, new systems and techniques directed to logic design and verification are desirable.

SUMMARY OF THE INVENTION

The invention provides techniques directed to realizing and verifying a logic model design by first dividing the logic model design into two or more logic portions. A realization of a first logic model portion is then performed to produce a first realized logic portion. In this fashion, the logic design can be piecemeal realized.

Subsequently a first wrapper can be applied to the first realized logic portion and the functionality of the first wrapped realized logic portion can be verified against the model of itself, using formal verification methods. Second and further realized portions can be treated in a similar manner until the entire circuit design is verified.

By piecemeal realizing portions of a design's logic model, as opposed to realizing the entire logic model, realization can be performed using relatively modest computer resources and in a more timely manner. Furthermore, by applying wrappers specific to each realized logic portion, verification of the individual realized portions can also be achieved using relatively modest computer resources.

As it is known that the wrappers used to verify a realized logic portion are themselves subject to error, the described embodiment of present invention provides an approach to verifying wrappers by first applying the same wrapper used with the first realized logic portion to a second portion of the logic model design and performing formal verification on the second wrapped logic model portion with a second realized logic portion. Accordingly, integrated circuits can be both realized and verified using relatively modest computer resources as compared to realizing and verifying a whole logic design at once. Others features and advantages will become apparent in part from the following descriptions and accompanying figures and in part by performing the invention.

BRIEF DESCRIPTION OF THE DRAWINGS

The invention is described in detail with regard to the following figures, wherein like numerals reference like elements, and wherein.

DETAILED DESCRIPTION

Figure 1:
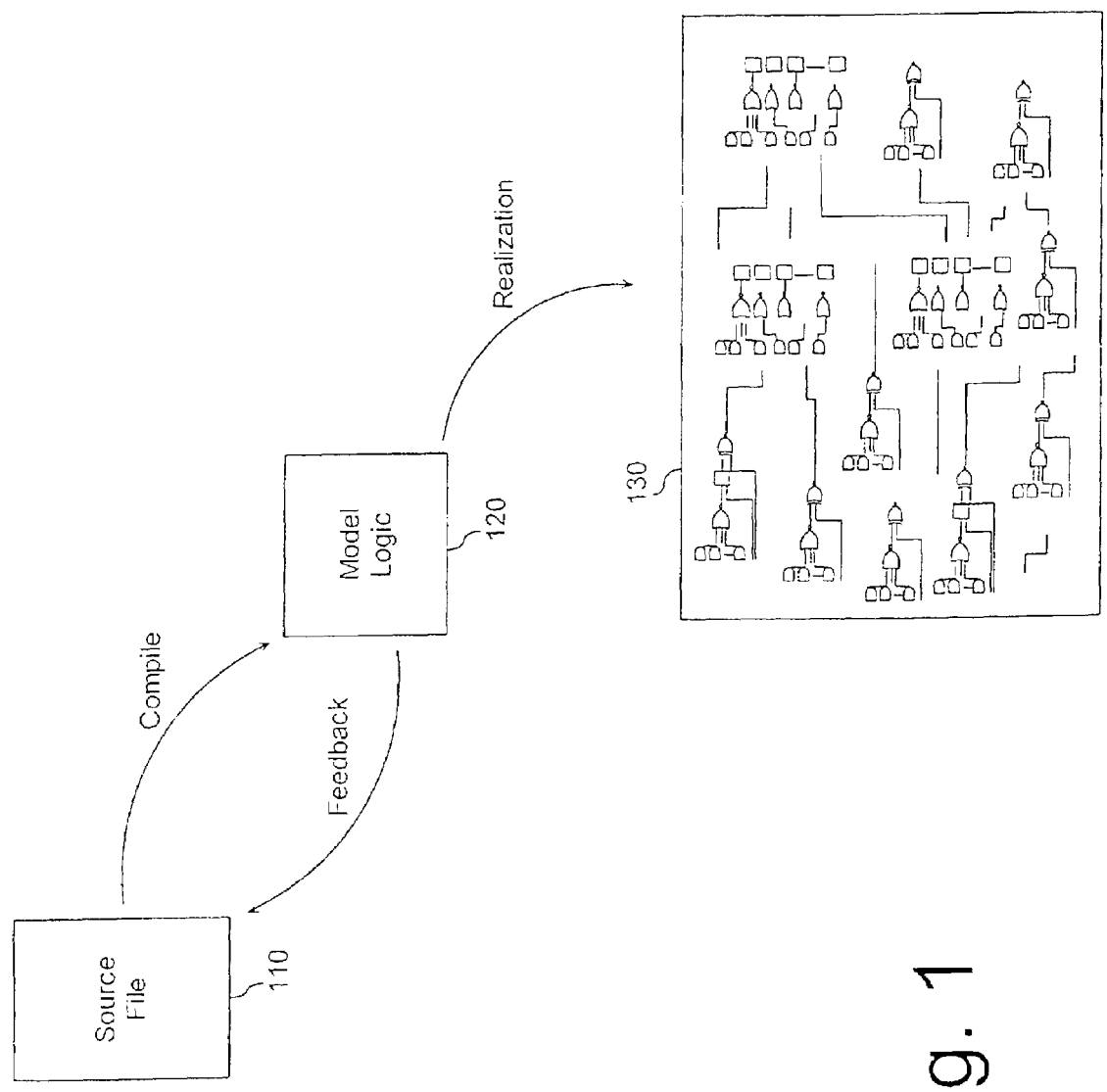
FIG. 1 depicts a progressive development of a logic design for an integrated circuit.

FIG. 1 depicts the progressive development of a logic design for an integrated circuit. As shown in FIG. 1, an integrated circuit's logic design can start with a source file 110. The exemplary source file 110 is a very high-level descriptive language (vhdl) based text file. However, it should be appreciated that the source file 110 alternatively can be based on any number of text-based languages, such as vhdl, verilog, any number of schematic entry based tools or any other known or later developed paradigm useful for entering and/or designing logic circuits without departing from the present invention as defined in the claims.

Once the source file 110 is initially created, a logic designer may wish to compile and optionally simulate the source file 110 to create the design's logic model 120. As discussed above, compiling a source file may reveal any number of errors and warnings. That is, each time the designer compiles the source file 110, the designer can receive feedback from a compiler that can help eliminate design errors as well as eliminate or understand any residual warnings. Accordingly, developing the logic model 120 can involve any number of iterations of compiling/analyzing feedback until the designer is reasonably confident of the source file's correctness. The resulting logic model 120 can then be realized to produce the design's realized logic 130.

As discussed above, the process of realizing a logic model involves converting the logic model from abstract mathematical and functional relationships, e.g., VHDL equations, to a more low-level form consisting of a description of various logic circuits and interconnecting pins. Realizing a particular logic model can be accomplished using various computer-based tools that can automatically determine/generate the logic resources necessary to provide the functionality of the logic model. Alternatively, realization can be performed manually, either in it's entirety or in part, by a designer. However, the particular processes used to realize a particular logic model can vary as required or otherwise desired by a designer without departing from the present invention.

The exemplary realized logic 130 may consist of an netlist of representative logic gates, buffers and other components plus a number of representative interconnecting nodes (pins) as well as representative nodes (pins) that interface the various internal logic components to the outside world, for example. However, it should be appreciated that the composition of the realized logic 130 can include any combination of known or later developed components configured according to any known or later developed technology capable of receiving, processing, transmitting or otherwise manipulating logic signals without departing from the present invention as defined in the claims.

Figure 2:
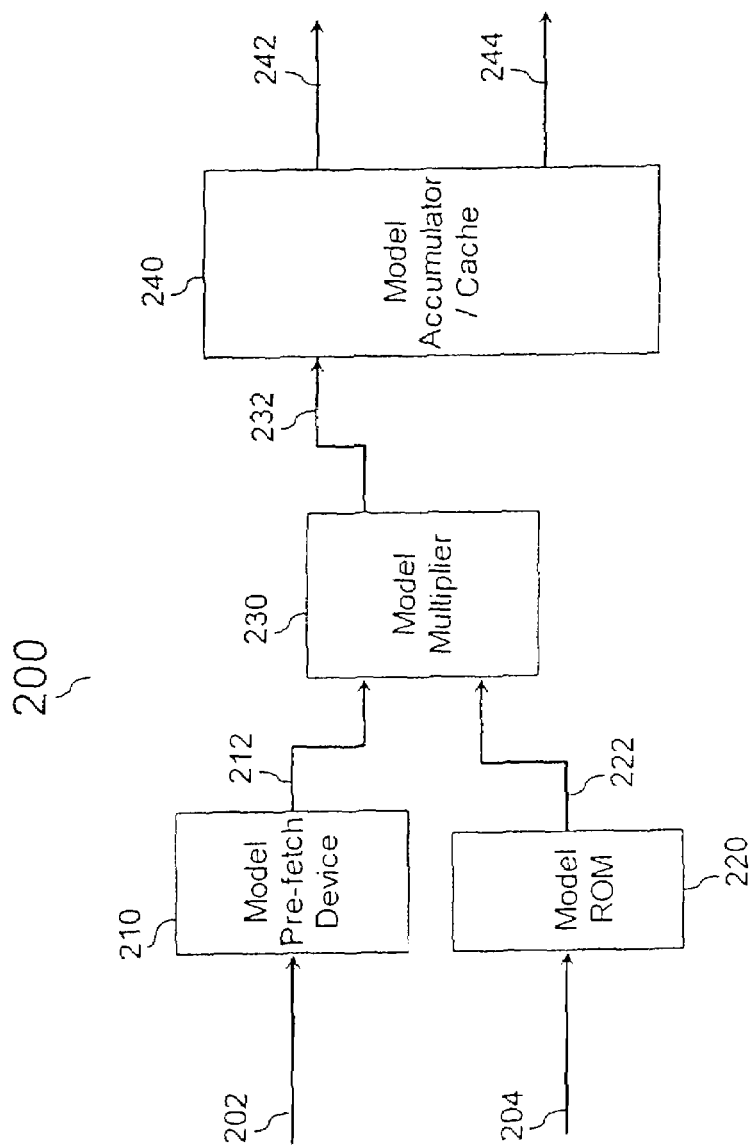
FIG. 2 is a block diagram of an exemplary logic model design.

FIG. 2 is a diagram of an exemplary block of a logic model 200. The logic model 200 includes a model pre-fetch device 210, a model read-only memory (ROM) 220, a model multiplier 230 and a model accumulator/cache 240. In operation, the model pre-fetch device 210 can receive a stream of numbers via link 202 and provide the numbers to the model multiplier 230 via link 212. The model ROM 220 can receive a stream of addresses via link 204 and produce a stream of numbers stored internally to the model ROM 220 indexed according to the received addresses. The stream of indexed numbers can then be provided to the model multiplier 230 via link 222.

The model multiplier 230 can receive the streams of numbers, multiply the numbers to produce a stream of products and provide the stream of products to the model accumulator/cache 240 via binary link 232.

The model accumulator/cache 240 can receive the stream of products, store the products in an internal buffer (not shown) and produce a running accumulation of the last N products in the product stream using an internal accumulator (also not shown). The model accumulator/cache 240 can then provide the running product accumulation to a first external device via link 242, and further provide the buffered products to a second external device via link 244.

Figure 3:
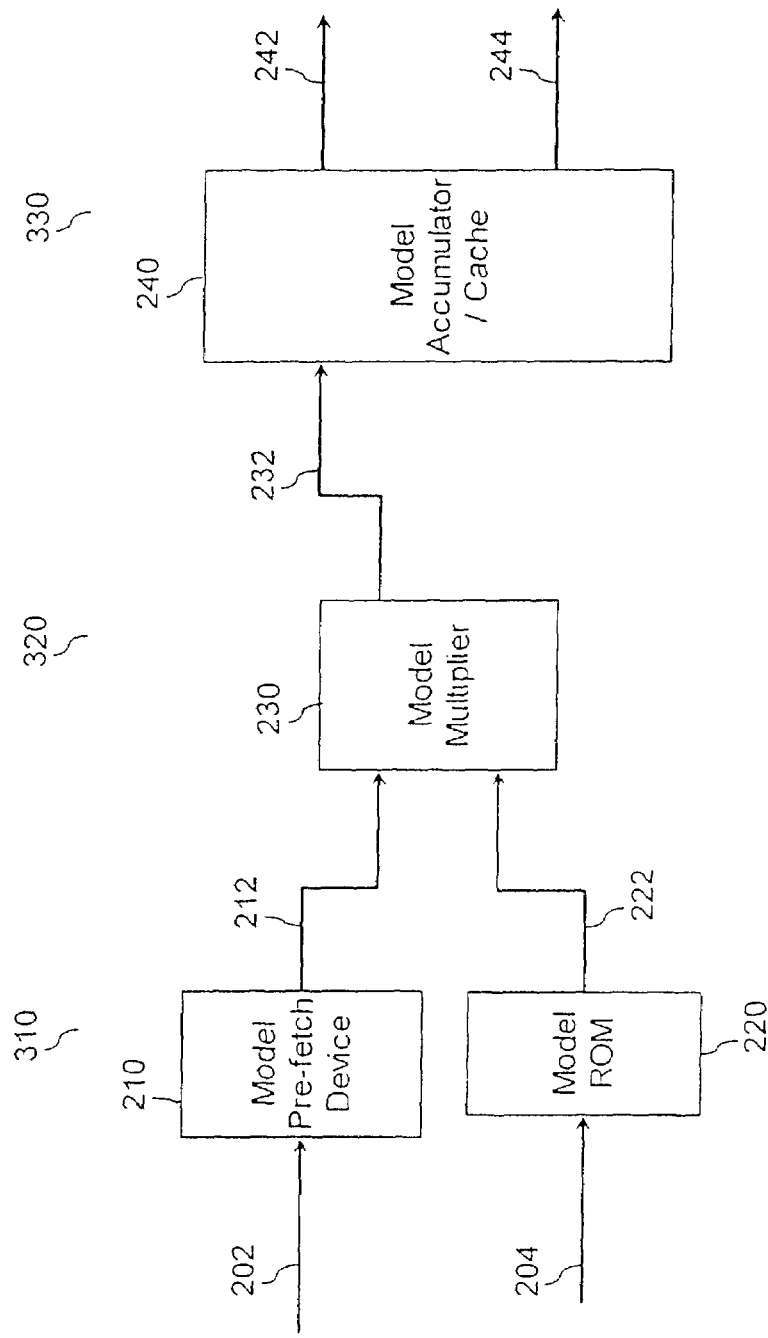
FIG. 3 depicts the logic model design of FIG. 2 conceptually divided into three logic portions.

The particular composition of the logic model 200 is not important and the exemplary logic configuration is provided only as a functional reference. Accordingly, the particular configuration/composition of the logic model 200 can vary as appropriate to the specific requirements of a logic design without departing from the present invention FIG. 3 depicts the logic model design of FIG. 2 conceptually divided into three logic portions 310, 320 and 330. As shown by FIG. 3, the first portion 310 of the logic model includes the model pre-fetch device 210 and model ROM 220, the second portion 320 of the logic model includes the model multiplier 230 and the third portion 330 of the logic model includes the model multiplier/cache 240. The exemplary division of the various model components 210-240 within the various portions 310-330 is made for illustrative purposes only and it should be appreciated that the exemplary logic model 200, as well as any other logic model design, can be conceptually divided along any practicable lines without departing from the present invention as defined in the claims.

Figure 4:
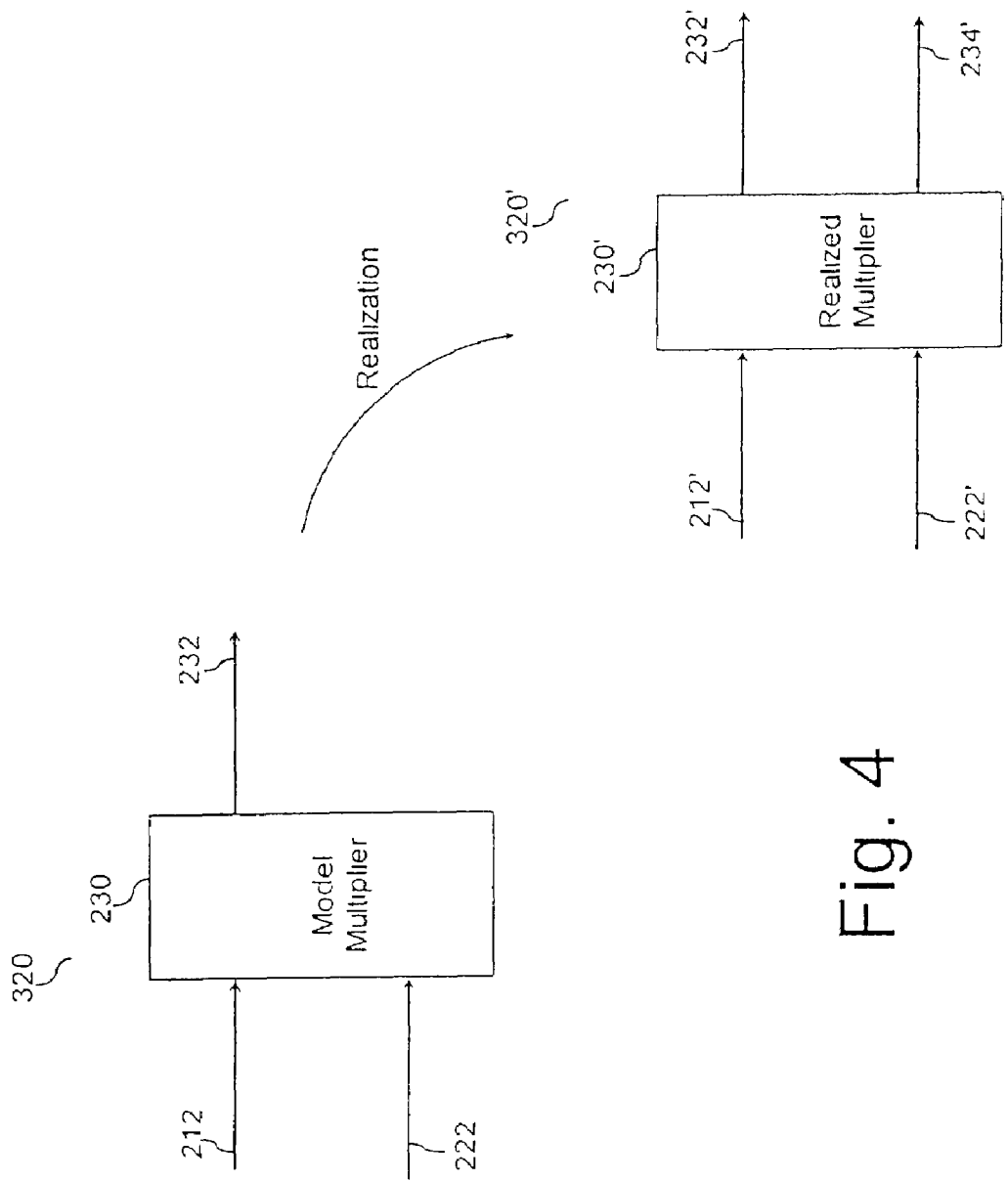
FIG. 4 depicts the realization of a second logic portion of the logic model of FIG. 3.

FIG. 4 depicts the second logic model portion 320 along with a respective second realized logic portion 320' consisting of a realized multiplier 230', which can be fed streams of numbers via links 212' and 222' and provide streams of product information via links 232' and 234', where the combination streams of product information can contain the same information as the model output 232. As discussed above, a logic model can consist of a number of abstract equations and functional relationships while a respective realized logic can consists of any number of known or later developed logic components and interconnects capable of providing the functionality required by the equations and functional relationships of the logic model. However, it should be appreciated that a realized logic portion may vary significantly in various embodiments as long as the realized logic portion provides all basic functionality of its respective logic model portion. For example, while the exemplary second logic model portion 320 has output 232, the second realized logic portion 320' may alternatively provide two outputs 232' or 234', that provide the same product information as the model output 232, but in a different numerical format.

Alternatively, the basic logic model may have two links 232 and 234 that provide all of the required information on one pin while grounding (providing a logic 0) to the other pin as functionality may be preserved if the second realized logic portion 320' provides the necessary product information on one of its output links 232' or 234' while providing a ground (logic zero) on the other link 234' or 232'.

Furthermore, it should be appreciated that output links 232' or 234' can provide product information in any number of unique forms. For example, in various embodiments links 232' and 234' may both be N-bit busses carrying different numbers that must necessarily be added together to represent a single stream of product information. In other embodiments, links 232' or 234' may carry portions of information that must be added/combined or otherwise manipulated according to any useful approach that can be matched to the model format via a set of mathematical manipulations.

Still further, links 232' and 234' may provide product information in any combination of forms. For example, in various other embodiments link 232' may provide product information in one's-compliment form while link 234' may provide product information in two's-compliment form.

Thus, as demonstrated above, it should be appreciated that any number of variances between logic model and realized logic may occur as design choices subject to the restriction that the basic functionality of the realized logic must be preserved.

Figure 5:
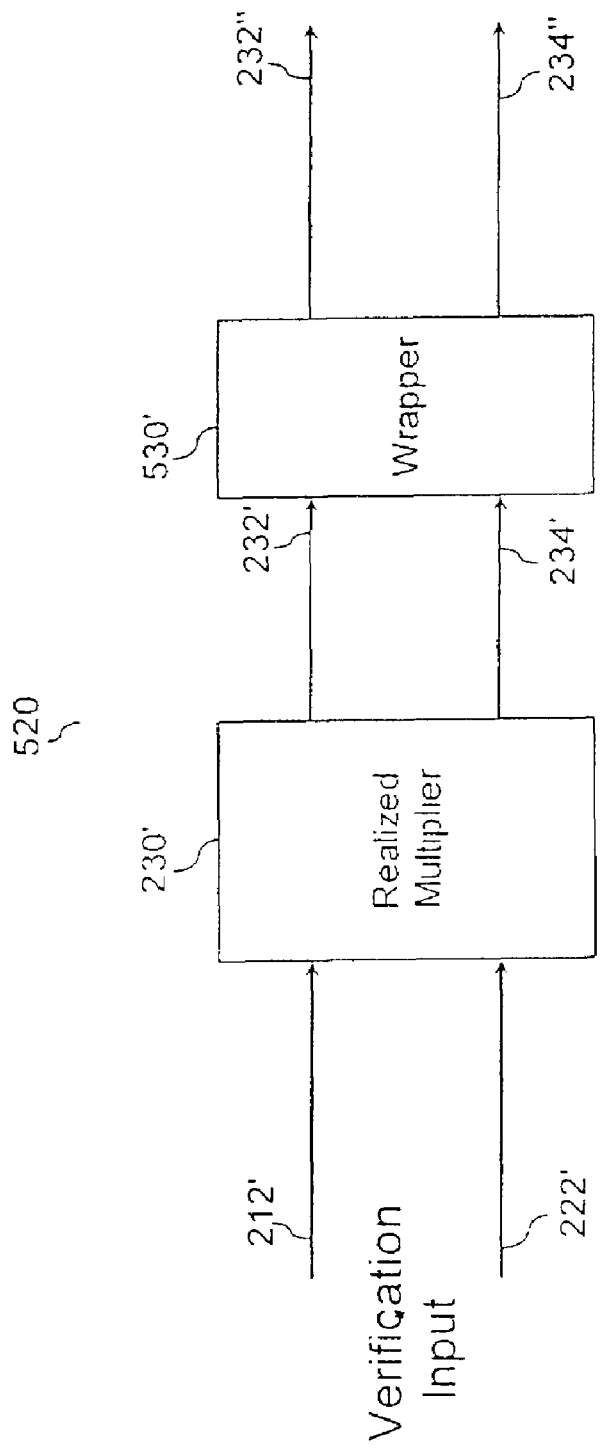
FIG. 5 depicts the second realized logic portion of FIG. 4 with a wrapper applied to it.

FIG. 5 depicts a wrapped realized logic block 520. The wrapped realized logic block 520 includes the second realized logic portion 230' of FIG. 4 with an appropriately designed wrapper 530. As shown in FIG. 5, the realized multiplier 230' can receive streams of numbers via links 212' and 222' from a simulation or verification source (not shown), and provide a stream of products to the wrapper 530 via links 232' and 234'. The wrapper 530, in turn, can receive the product stream, measure, record, manipulate or otherwise process the received product stream and pass the received product stream to an external device (also not shown) via links 232" and 234".

As discussed above, a wrapper can be a software construct that enables a designer to interact with a logic design on a pin (nodal) level, e.g., tie off a set of pins and add together two buses to make the results identical, etc. As various realized logic portions may vary in their particular form as long as basic functionality is preserved, it should be appreciated that an appropriately designed wrapper should account for these variances. For example, a realized multiplier that produces one's compliment data or redundant data would need a different wrapper than a realized multiplier that produces two's compliment data. Similarly, a realized multiplier that provided product information in alternative cycles between links 232' and 234' would require a third wrapper unique to the particular realization.

Figure 6:
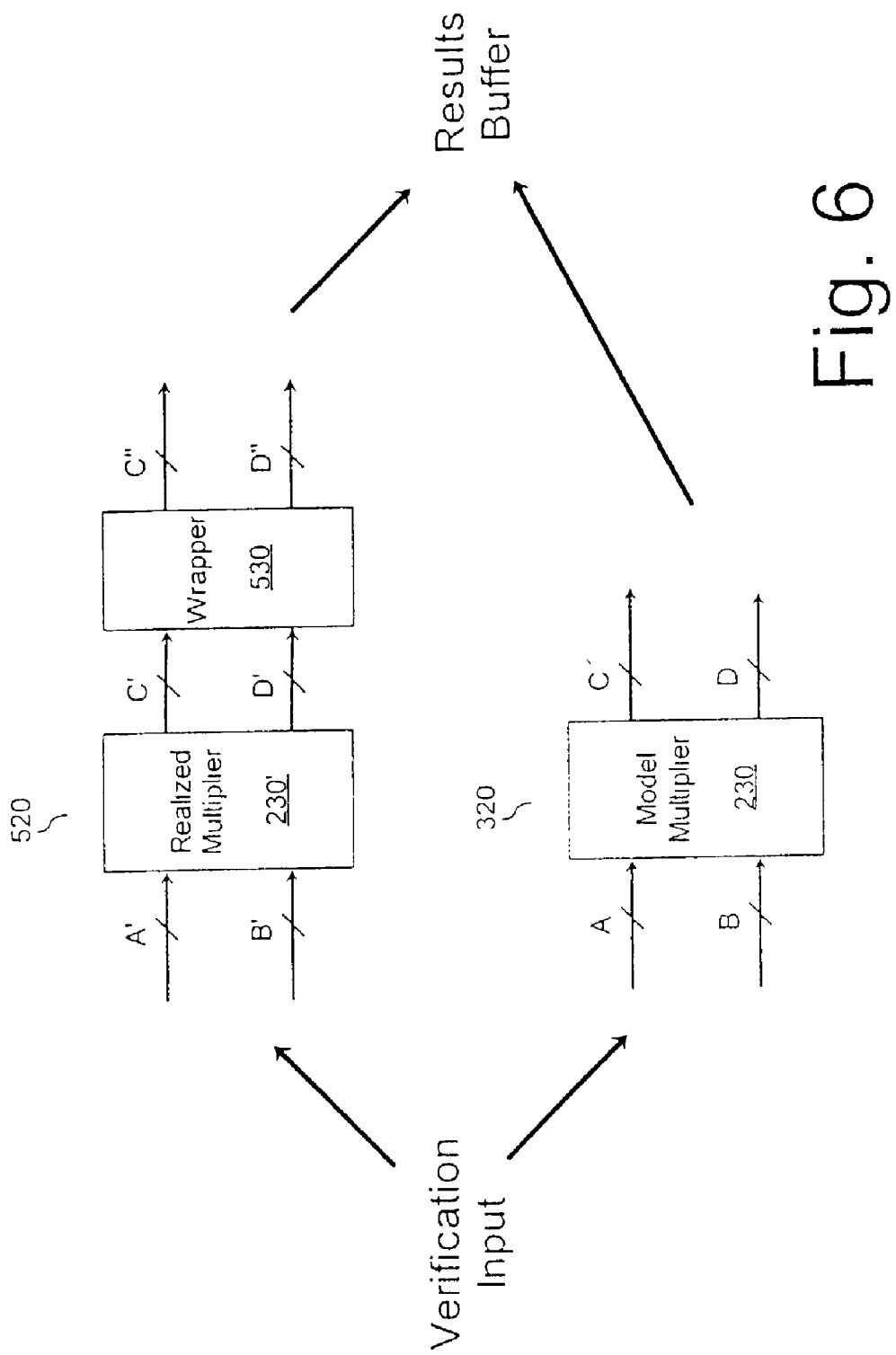
FIG. 6 schematically depicts the verification of the wrapped second realized logic portion of FIG. 5.

FIG. 6 depicts a verification process on the realized logic design and its respective wrapper against its model. Generally, verification is performed according to a known "formal verification" process that can include any of several well-known approaches where a logic design is reduced to its essential equations and fed various information necessary to prove that the logic design operates as expected. Formal verification tools generally verify a realized design against a model design according to those known processes by, among other means, providing the inputs for both a model and realized design and checking that the same results are produced by both the model and the realized design. While the exemplary verification process uses an array of known formal verification techniques, it should be appreciated that in other embodiments, verification can be performed using simulation techniques (at the expense of time and computer resources) or any other known or later developed technique useful for verifying a logic design.

As discussed above, a wrapper must not only be tailored to a particular logic realization, but a every wrapper is subject to being erroneously implemented. That is, a wrapper may inadvertently affect the performance of a realized logic portion. Accordingly, it may be necessary to validate the wrapper independently.

The exemplary approach of the present invention can verify a wrapper used on the output of a particular logic portion by applying the same wrapper to the input of a subsequent logic portion and similarly verifying the subsequently wrapped logic portion. Through the rule of associativity, the wrapper can be proved to have no influence on the functionality of the first wrapped realized logic portion.

Figure 7:
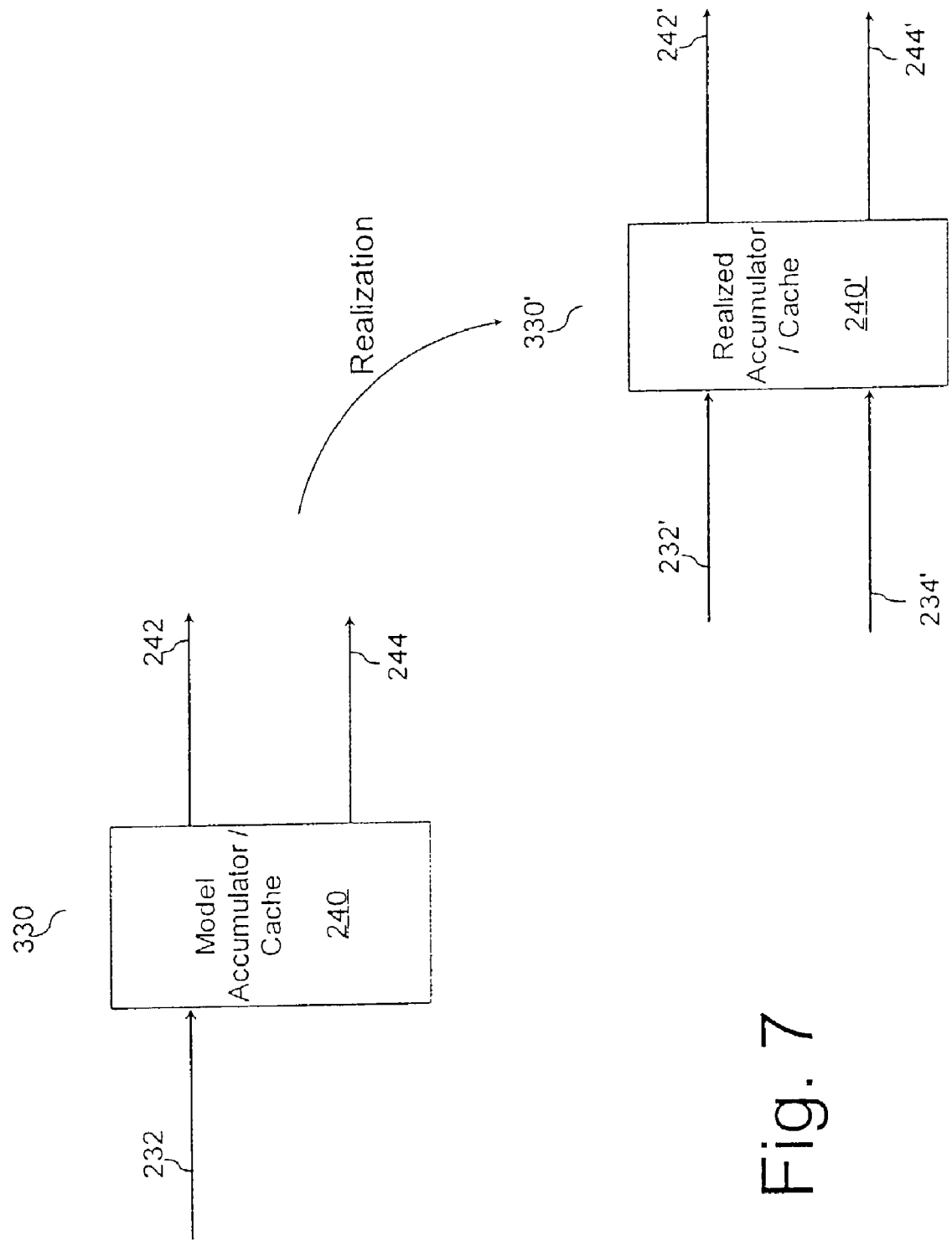
FIG. 7 depicts the realization of the third logic portion of the logic model of FIG. 3.

This wrapper verification technique starts with realizing another portion of the logic model. As depicted in FIG. 7, the third logic model portion 330, which follows the second logic model portion 320, can be realized to produce a respective third realized logic portion 330'. The third realized logic portion 330' can receive a stream of product information via links 232' and 234' and provide various other signals to external devices via links 242' and 244'.

Figure 8:
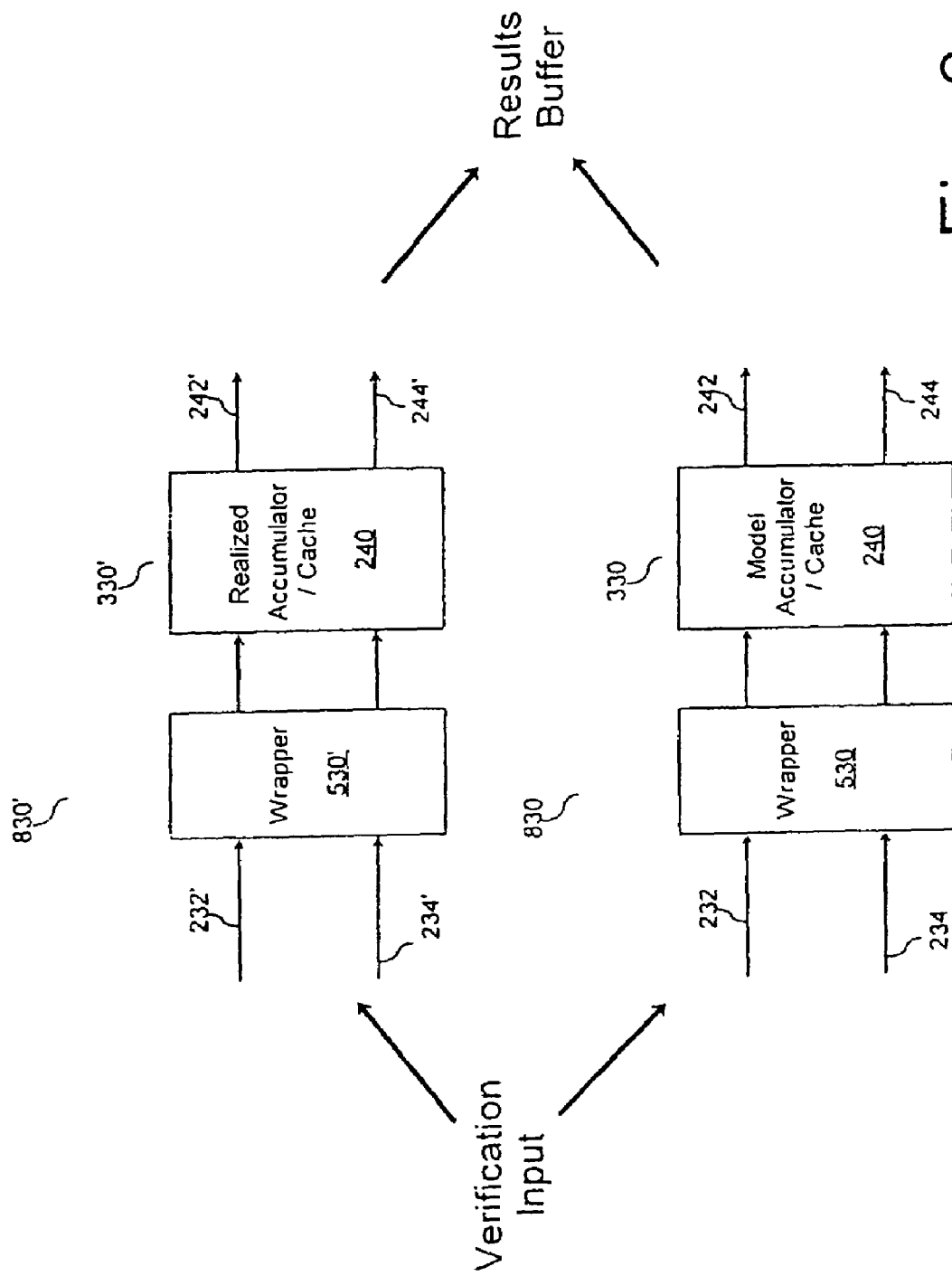
FIG. 8 depicts the verification of the third realized logic portion of FIG. 5.

FIG. 8 depicts the next steps for validating the wrapper 530. As shown in FIG. 8, the wrapper 530 can be applied to the third logic model portion 330 and the respective realized logic portion 330'. A verification can then be performed between the model and wrapper, and the realized logic portion and wrapper. If the model and realized outputs are identical or otherwise sufficiently similar, the wrapper 530 may be deemed valid.

Figure 9:
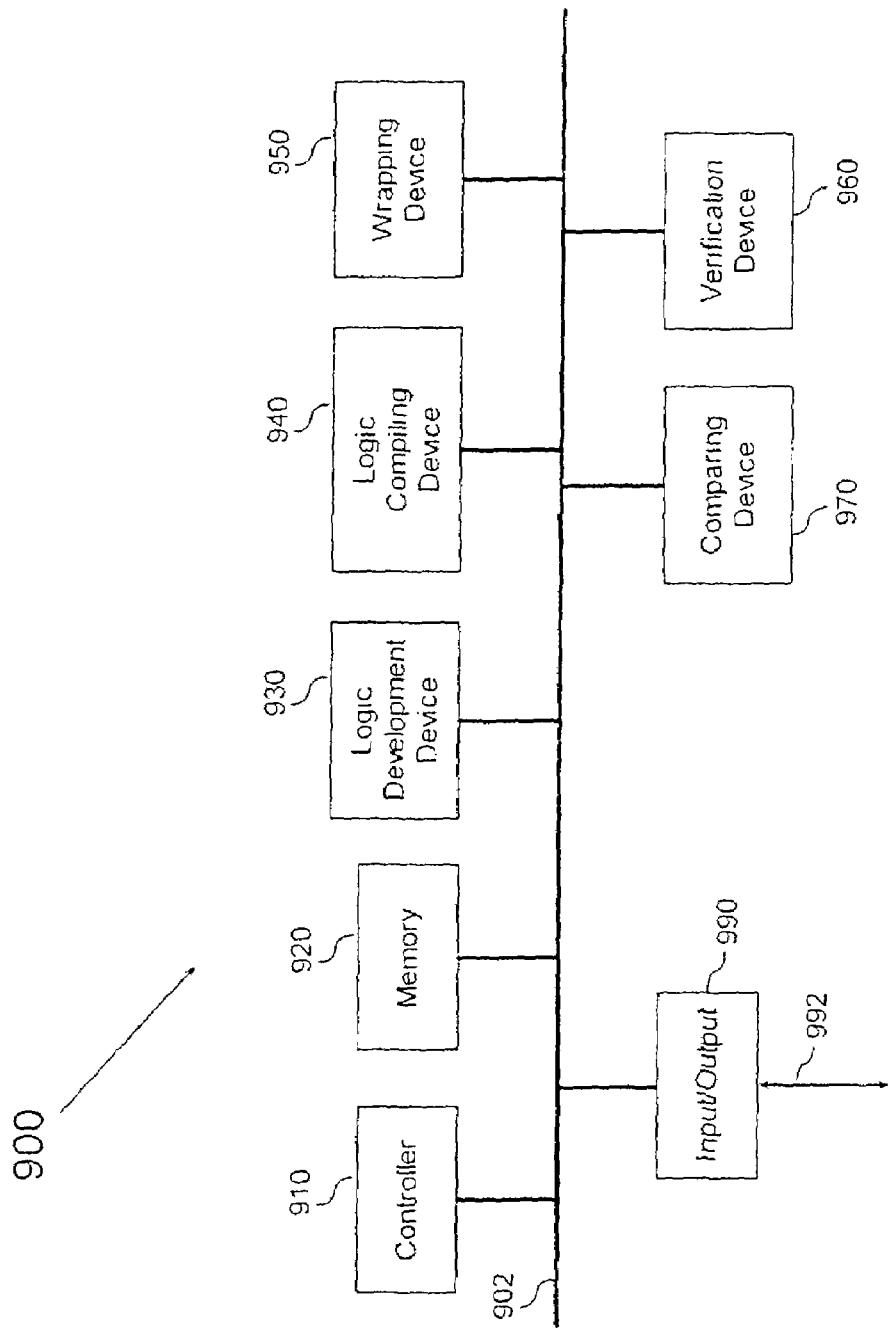
FIG. 9 is a block diagram of an apparatus capable of realizing and verifying a logic design according to the present invention.

FIG. 9 is a block diagram of a design/verification apparatus 900 capable of realizing and verifying a logic design according to the present invention. As shown in FIG. 9, the verification/verification apparatus 900 includes a controller device 910, a memory device 920, a logic development device 930, a logic compiling device 940, a wrapping device 950, a verification device 960, a comparing device 970 and an input/output 990 coupled together via control/data bus 902.

While the exemplary apparatus 900 uses a bussed architecture, it should be appreciated that the apparatus 900 can be implemented using any number of architectures, such as an architecture based on fixed electronic circuits, programmable logic and the like without departing from invention as defined in the claims. Similarly, two or more of the devices 910-970 may be combined in one device or distributed among different devices in a manner other than that shown. For example, any or all of devices 930-970 may be implemented as software modules residing in memory 920 and executed by means of the processor 910.

In operation, the controller 910 can receive a set of first commands and data directed to logic entry and development via the input/output device 990 and link 992 and store the set of first commands and data in the memory 920. The memory 920, in turn, can provide the set of first commands and data to the logic development device 930 and the logic compiling device 940 in such a fashion that a logic source file and respective logic model design can be derived according to a particular set of predetermined rules and syntax, such as that provided by VHDL or Verilog.

Once a logic model is initially developed, the logic development device 930 can conceptually divide the logic model into two or more logic model portions and then realize each model portion to provide a number of realized logic portions. The exemplary development/verification apparatus 900 uses a number of automatic software tools to realize a logic model portion. However, as discussed above, a logic model portion can be derived automatically or manually by a designer in whole or in part without departing from the present invention as defined in the claims.

The logic development device 930 can then provide a first realized logic portion to the wrapping device 950. The wrapping device 950, in turn, can receive the first realized logic portion and apply a specially crafted wrapper to the first realized logic portion. The wrapping device 950 can then provide the wrapped first realized logic portion to the verification device 960.

The verification device 960 can receive the wrapped first realized logic portion along with the corresponding logic model portion and perform a verification process, e.g., a formal verification, by operating on both logic portions, i.e., feeding the logic portions various input information and receiving/storing resultant output data. The resultant output data can then be provided to the comparing device 970 where the output data can be compared for correctness.

If the output data for both model and realized design are identical or otherwise sufficiently similar, the simulation device 970 can alert a logic designer of the realized portions apparent correctness via the input/output device and link 992. Otherwise, the verification device 970 can alert the designer of any discrepancy indicating that at least one of the first realized logic portion or its wrapper is problematic.

Assuming that there are no problems indicated, the development/verification apparatus 900 can then undertake to verify the wrapper. Accordingly, the logic development device 930 can provide any logic model portion that follows the logic model portion just tested to the wrapping device 950. The wrapping device 950, in turn, can apply the wrapper to this second logic model portion and provide the wrapped second logic model portion to the verification device 960.

The verification device 960, in turn, can receive the wrapped second logic model portion along with the corresponding second realized logic portion and perform verification operations on both logic portions. The resultant outputs can then be provided to the comparing device 970 where the outputs can be compared for correctness.

If the outputs are identical or otherwise sufficiently similar, the wrapper is verified, i.e., proved to be correct through the associativity rule, and the comparing device 970 can alert a logic designer that the wrapper is apparently correct in its design. Otherwise, the comparing device 970 can alert the designer of any discrepancy.

Figure 10:
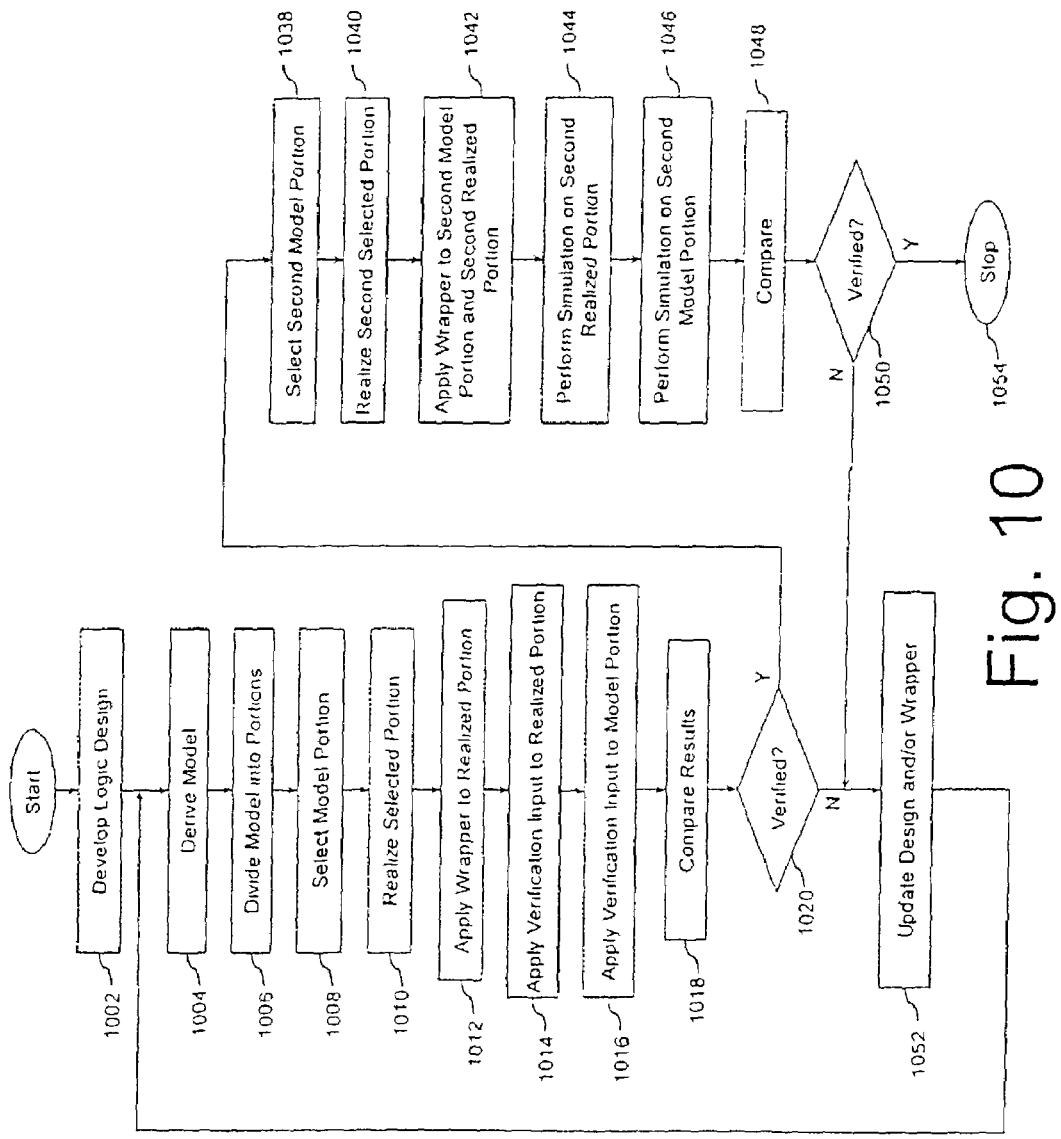
FIG. 10 is a flowchart outlining an exemplary operation for realizing and verifying a logic design embodying the present invention.

FIG. 10 is a flowchart outlining an exemplary operation for realizing and verifying a logic design embodying the present invention. The process starts in step 1002 where a logic design is initially developed. Next, in step 1004, logic model is derived from the logic design of step 1002. Then, in step 1006, the logic model is divided into two or more portions. As discussed above, the particular divisions that separate the various model portions can vary along any practicable lines without departing from the invention as defined in the claims. Control continues to step 1008.

In step 1008, a first logic model portion is selected. Next, in step 1010, the selected logic model portion is realized according to known or later developed technique. Then, in step 1012, a wrapper is applied to the selected realized logic portion. As discussed above, a wrapper can be specific to the particular design choices of a designer and accordingly, different embodiments of a realized logic portion will require different wrappers. Control continues to step 1014.

In step 1014, a verification operation is performed on the wrapped realized logic portion to produce a realized output. As discussed above, a verification operation can be part of an overall formal verification process and can include providing a logic portion with various input information/stimulus and recording/measuring the resultant output information. Next, in step 1016, a similar verification operation is performed on the respective logic model portion to produce a model output. Then, in step 1018, the realized output and model output generated from steps 1014 and 1016 respectively are compared to verify the realized logic portion for correctness. Control continues to step 1020.

In step 1020, a determination is made as to whether the first realized logic portion is verified, i.e., whether the realized output and model output generated and compared in steps 1014-1018 match or are deemed sufficiently similar. If the first realized logic model portion is verified, control jumps to step 1038; otherwise, control continues to step 1052.

In step 1052, at least one of the logic model and wrapper are modified to troubleshoot the logic design and control jumps back to step 1004 (or optionally step 1010 to avoid some steps that may not be necessary in some circumstances).

Otherwise, in step 1038, a second logic model portion is selected. As discussed above, the second logic model portion should follow the first logic model portion, i.e., the first portion should feed at least one signal directly to the second logic model portion. Next, in step 1040, the second selected model portion is realized. Control continues to step 1042.

In step 1042, the wrapper applied in step 1012 is applied to the second logic model portion. Next, in step 1044, a verification operation is performed on the second realized logic portion to produce a second realized output. Then, in step 1046, a similar verification operation is performed on the respective wrapped second logic model portion to produce a second model output. Control continues to step 1048.

In step 1048, the second realized output and second model output are compared. Next, in step 1050, a determination is made as to whether the wrapper is verified, i.e., whether the second realized output and second model output match or are deemed sufficiently similar. If the wrapper is verified, control jumps to step 1054 where the process stops; otherwise, control jumps to step 1052 where at least one of the logic model and wrapper are modified to troubleshoot the logic design. Control then jumps back to step 1004 where a new logic model is derived based on the updates of step 1052. Control can continue to loop along steps 1004-1052 until at least both the first realized logic portion and respective wrapper are verified.

In various embodiments where the above-described systems and/or methods are implemented using a programmable device, such as a computer-based system or programmable logic, it should be appreciated that the above-described systems and methods can be described by any of various known or later developed programming languages, such as "C", "C++", "FORTRAN", Pascal", "VHDL" and the like.

Accordingly, various storage media, such as magnetic computer disks, optical disks, electronic memories and the like, can be prepared that can contain information that can direct a device to implement the above-described systems and/or methods. Once an appropriately capable device has access to the information contained on the storage media, the storage media can provide the information to the device, thus enabling the device to perform the above-described systems and/or methods.

For example, if a computer disk containing the appropriate information, such as a source file, an object file, an executable file or the like, were provided to a computer, the computer could receive the information, appropriately configure itself and perform the functions of the various elements of FIGS. 1-9 and/or the flowchart of FIG. 10 to implement the various realization and/or verification functions. That is, the computer could receive various portions of information from the disk relating to different elements of the above-described systems and/or methods, implement the individual systems and/or methods and coordinate the functions of the individual systems and/or methods to realize and/or verify a logic portion and/or wrapper.

In still other embodiments, rather than providing a fixed storage media, such as a magnetic-disk, information describing the above-described systems and methods can be provided using a communication system, such as a network or dedicated communication conduit. Accordingly, it should be appreciated that various programs, executable files or other information embodying the above-described systems and methods can be downloaded to a programmable device using any known or later developed communication technique.

As shown in FIGS. 1-10, the systems and methods of this invention are preferably implemented using a general purpose computer having various complimentary components and peripherals. However, the systems and methods can also be implemented using any combination of one or more general purpose computers, special purpose computers, program microprocessors or microcontroller and peripheral integrating circuit elements, hardware electronic or logic circuits such as application specific integrated circuits (ASICs), discrete element circuits, programmable logic devices such as PLAs, FPGAs, PALs or the like. In general, any device on which exists a finite state machine capable of implementing the various elements of FIGS. 1-9 and/or the flowchart of FIG. 10 can be used to implement the training sequence functions.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the invention as defined in the claims.

What is claimed is:

1. A method for realizing a logic model design, comprising:
    dividing a logic model design into two or more logic model portions;
    performing a realization step on a first logic model portion to produce a first realized logic portion;
    applying a first wrapper to the first realized logic portion;
    verifying the functionality of the first wrapped realized logic portion; and
    verifying the functionality of the first wrapper if the first wrapped realized logic portion is verified to be functioning correctly.

2. The method of claim 1, wherein verifying the functionality of the first realized logic portion includes performing a verification operation on the first wrapped realized logic portion to produce a first realized output.

3. The method of claim 1, wherein verifying the functionality of the first realized logic portion includes:
    performing a verification operation on the first wrapped realized logic portion to produce a first realized output;
    performing a verification operation on the first logic model portion to produce a first model output; and
    comparing the first realized output to the first model output.

4. The method of claim 3, further comprising:
    performing a realization step on a second logic model portion to produce a-second realized logic portion; and
    performing a verification operation on the second realized logic portion to produce a second realized output.

5. The method of claim 4, further comprising:
    applying the first wrapper to the second logic model portion;
    performing a verification operation on the second wrapped logic model portion to produce a second model output; and
    comparing the second realized output to the second model output.

6. The method of claim 3, wherein the functionality of the first wrapper is verified using an associativity-based technique.

7. The method of claim 3, wherein verifying the functionality of the first wrapper includes:
    applying the first wrapper to a second logic model portion, and
    performing a verification operation on the second wrapped logic model portion to produce a second model output.

8. The method of claim 7, wherein verifying the functionality of the first wrapper further includes:
    performing a verification operation on the second realized logic portion to produce a second realized output, and
    comparing the second realized output to the second model output.

9. The method of claim 7, wherein the first wrapper is applied to the output of the first realized logic portion and further applied to the input of the second logic model portion.

10. The method of claim 8, wherein an input of the second logic model portion is logically linked to an output of the first logic model portion.

11. A machine-readable medium including instructions for realizing a logic model design and being arranged to cause a machine to perform the steps of:
    dividing a logic model design into two or more logic model portions;
    performing a realization step on a first logic model portion to produce a first realized logic portion;
    applying a first wrapper to the first realized logic portion;
    verifying the functionality of the first wrapped realized logic portion; and
    verifying the functionality of the first wrapper if the first wrapped realized logic portion is verified to be functioning correctly.

12. The machine-readable medium of claim 11, wherein verifying the functionality of the first realized logic portion includes performing a verification operation on the first wrapped realized logic portion to produce a first realized output.

13. The machine-readable medium of claim 11, wherein verifying the functionality of the first realized logic portion includes:
    performing a verification operation on the first wrapped realized logic portion to produce a first realized output;
    performing a verification operation on the first logic model portion to produce a first model output; and
    comparing the first realized output to the first model output.

14. The machine-readable medium of claim 13, further including the steps of:
    performing a realization on a second logic model portion to produce a second realized logic portion; and
    performing a verification operation on the second realized logic portion to produce a second realized output.

15. The machine-readable medium of claim 14, further including the steps of:
    applying the first wrapper to the second logic model portion;
    performing a verification operation on the second wrapped logic model portion to produce a second model output; and
    comparing the second realized output to the second model output.

16. The machine-readable medium of claim 13, wherein the step of verifying the functionality of the first wrapper uses an associativity-based technique.

17. The machine-readable medium of claim 13, wherein verifying the functionality of the first wrapper includes:
    applying the first wrapper to a second logic model portion, and
    performing a verification operation on the second wrapped logic model portion to produce a second model output.

18. The machine-readable medium of claim 17, wherein verifying the functionality of the first wrapper further includes:
    performing a verification operation on the second realized logic portion to produce a second realized output, and
    comparing the second realized output to the second model output.

19. The machine-readable medium of claim 18, wherein the first wrapper is applied to the output of the first realized logic portion and the further applied to the input of the second logic model portion.

20. The machine-readable medium of claim 18, wherein an input of the second logic model portion is logically linked to an output of the first logic model portion.

21. An apparatus for realizing a logic model design, comprising:
    logic development circuitry operable to divide a logic model design into two or more logic model portions, said development circuitry being further operable to realize at least one logic model portion to form a first realized logic portion;
    a wrapping device that applies a first wrapper to the first realized logic portion; and
    one or more second devices that verify the functionality of the first wrapped realized logic portion and verify the functionality of the first wrapper if the first wrapped realized logic portion is verified to be functioning correctly.

22. The apparatus of claim 21, wherein the one or more second devices includes a verification device, that performs a verification operation on the first wrapped realized logic portion to produce a first realized output.

23. The apparatus of claim 21, wherein the one or more second devices includes:
    a verification device that performs a verification operation on the first wrapped realized logic portion to produce a first realized output, and wherein the verification device further performs a verification operation on the first logic model portion to produce a first model output; and
    a comparing device that compares the first realized output to the first model output.

24. The apparatus of claim 23, wherein the verification device further performs a verification operation on a second realized logic portion to produce a second realized output, the second realized logic portion being realized based on a second logic model portion.

25. The apparatus of claim 24, wherein the wrapping device further applies the first wrapper to the second logic model portion, wherein the verification device further performs a verification operation on the second wrapped logic model portion to produce a second model output and wherein the comparing device further compares the second realized output to the second model output.

26. The apparatus of claim 23, wherein the apparatus verifies the functionality of the first wrapper using an associativity-based technique.

27. The apparatus of claim 23, wherein the wrapping device further applies the first wrapper to a second logic model portion, and wherein the verification device further performs a verification operation on the second wrapped logic model portion to produce a second model output.

28. The apparatus of claim 27, wherein the verification device further performs a verification operation on the second realized logic portion to produce a second realized output, and the comparing device further compares the second realized output to the second model output.

29. The apparatus of claim 27, wherein the first wrapper is applied to the output of the first realized logic portion and the further applied to the input of the second logic model portion.

30. The apparatus of claim 28, wherein an input of the second logic model portion is logically linked to an output of the first logic model portion.

31. A method for realizing a logic model design, comprising:
    dividing a logic model design into two or more logic model portions;
    performing realization steps on first and second logic model portions to produce respective first and second realized logic portions;
    applying a first wrapper to the first realized logic portion and performing a verification operation to verify the first realized logic portion has correct functionality; and
    applying the first wrapper to the second logic model portion and performing a verification operation to verify the first wrapper if the first wrapped realized logic portion is verified to be functioning correctly.

32. A computer program product including a computer readable medium including program code for realizing a logic model design and arranged to cause performance of the steps of claim 31.

33. A method for realizing a logic model design divided into two or more logic model portions, comprising:
    realizing a first logic model portion to produce a first realized logic portion; and
    formally verifying the functionality of the first wrapped realized logic portion using a first wrapper applied to the first realized logic portion; and
    verifying the functionality of the first wrapper if the first wrapped realized logic portion is verified to be functioning correctly.

34. The method of claim 33, wherein verifying the first wrapper includes the step of:
    applying the first wrapper to a second realized logic portion; and
    performing a formal verification on the second wrapped logic model portion.

35. The method of claim 33, wherein verifying the first wrapper includes the step of:
    applying the first wrapper to a second logic model portion; and
    performing a formal verification on the second wrapped logic model portion.

36. The method of claim 34, wherein verifying the first wrapper uses an associativity-based technique.

* * * * *

UNITED STATES PATENT AND TRADEMARK OFFICE
CERTIFICATE OF CORRECTION

PATENT NO. : 7,567,892 B2
APPLICATION NO. : 10/284294
DATED : July 28, 2009
INVENTOR(S) : Barrett et al.

It is certified that error appears in the above-identified patent and that said Letters Patent is hereby corrected as shown below:

On the Cover Page, Item (57), in the second sentence of the Abstract, "The various model portions can then realized to form various realized logic portions" should read --The various model portions can then be realized to form various realized logic portions--.

In column 9, line 42 (claim 4), "portion to produce a-second realized logic portion; and" should read --portion to produce a second realized logic portion; and-- (the hyphen "-" between "a" and "second" should be deleted).

Signed and Sealed this

Ninth Day of November, 2010

David J. Kappos
*Director of the United States Patent and Trademark Office*